(12) United States Patent
Presti

(10) Patent No.: US 11,967,773 B2
(45) Date of Patent: Apr. 23, 2024

(54) DYNAMIC AMPLIFIER SUPPLY IN A PHASED ANTENNA ARRAY

(71) Applicant: Renesas Electronics America Inc., Milpitas, CA (US)

(72) Inventor: Calogero Presti, San Diego, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 497 days.

(21) Appl. No.: 17/215,288

(22) Filed: Mar. 29, 2021

(65) Prior Publication Data

US 2022/0311136 A1 Sep. 29, 2022

(51) Int. Cl.
| | |
|---|---|
| *H01Q 3/28* | (2006.01) |
| *H03F 3/24* | (2006.01) |
| *H04B 1/02* | (2006.01) |
| *H04B 1/38* | (2015.01) |

(52) U.S. Cl.
CPC ............. *H01Q 3/28* (2013.01); *H03F 3/245* (2013.01); *H03F 2200/451* (2013.01); *H04B 1/02* (2013.01); *H04B 1/38* (2013.01)

(58) Field of Classification Search
CPC ................................... H01Q 3/28; H03F 3/245
USPC ....................................................... 342/372
See application file for complete search history.

(56) References Cited

U.S. PATENT DOCUMENTS

| | | | | |
|---|---|---|---|---|
| 9,479,118 B2 * | 10/2016 | Khlat | ..................... | H03F 1/0227 |
| 9,967,006 B2 * | 5/2018 | Henseler | ............ | H01Q 21/0087 |
| 11,605,887 B1 * | 3/2023 | Sharma | .............. | H04B 7/18515 |
| 2018/0219516 A1 | 8/2018 | Soliman | | |
| 2021/0351506 A1 * | 11/2021 | Gorbachov | ............. | H03F 3/245 |

FOREIGN PATENT DOCUMENTS

| | | | |
|---|---|---|---|
| EP | 2224609 B1 | 8/2011 | |
| WO | WO-2020185780 A1 * | 9/2020 | ............. G01S 7/032 |

OTHER PUBLICATIONS

Extended European Search Report dated Jul. 12, 2022 issued in EP 22151794.9.

* cited by examiner

*Primary Examiner* — Harry K Liu
(74) *Attorney, Agent, or Firm* — SCULLY, SCOTT, MURPHY & PRESSER, P.C.

(57) ABSTRACT

Apparatuses and methods for adjusting a power capability of a system is described. In an example, a system can include an antenna array and a beamformer connected to the antenna array. The beamformer can include a communication channel. The system can further include a first power converter that can be configured to convert a supply voltage to a first regulated voltage. The first power converter can apply the first regulated voltage to the beamformer. The system can further include a second power converter that can be configured to convert the supply voltage to a second regulated voltage different from the first regulated voltage. The second power converter can apply the second regulated voltage to a power amplifier in the communication channel to adjust a maximum power capability of the power amplifier.

20 Claims, 6 Drawing Sheets

DYNAMIC AMPLIFIER SUPPLY IN A PHASED ANTENNA ARRAY

BACKGROUND

The present disclosure relates in general to a method and/or apparatus for independently adjusting a maximum power capability of one or more sections of an electronic device.

Phased antenna array can be used for generating steerable beams that may be utilized in wireless communication systems. For example, the phased antenna array can create a focused beam that can be steered relatively quickly to maintain a communication link within a communication system. A beamformer chip include power amplifiers that drive individual antenna elements of the phased antenna array to produce and steer the beams.

SUMMARY

In some examples, an apparatus for adjusting a maximum power capability is generally described. The apparatus can include a power converter. The power converter can be configured to convert a supply voltage to a regulated voltage. The power converter can be further configured to apply the regulated voltage to a power amplifier in a communication channel of a beamformer to adjust a maximum power capability of the power amplifier.

In some examples, a system for adjusting a maximum power capability is generally described. The system can include an antenna array and a beamformer connected to the antenna array. The beamformer can include a communication channel. The system can further include a first power converter configured to convert a supply voltage to a first regulated voltage. The first power converter can be further configured to apply the first regulated voltage to the beamformer. The system can further include a second power converter configured to convert the supply voltage to a second regulated voltage different from the first regulated voltage. The second power converter can be further configured to apply the second regulated voltage to a power amplifier in the communication channel to adjust a maximum power capability of the power amplifier.

In some examples, a method for operating a beamformer is generally described. The method can include receiving a supply voltage. The method can further include converting the supply voltage to a regulated voltage. The method can further include applying the regulated voltage to a power amplifier in a communication channel of a beamformer to adjust a maximum power capability of the power amplifier.

Further features as well as the structure and operation of various embodiments are described in detail below with reference to the accompanying drawings. In the drawings, like reference numbers indicate identical or functionally similar elements.

DETAILED DESCRIPTION

In some examples, power specification of a beamformer chip for a phased antenna array can be designed according to applications or systems that may use the beamformer chip. However, these applications or systems may require changes to the power specifications during a development cycle of the beamformer chip. Any change to the power specifications of the beamformer chip can involve multiple design iterations, causing issues such as additional cost and time to finish development of the beamformer chip. In an example, some beamformer chips can be overdesigned (e.g., having power amplifiers with higher than requested maximum power capability) to prepare for cases where the applications and systems may require more power during implementation. However, overdesigning the beamformer chips may reduce an efficiency of the beamformer chip due to power consumption that may be more than necessary. In other examples, multiple stock keep units (SKU) of a beamformer chip with different power capabilities can be designed, but the additional SKUs can inflate development cost and time.

Figure 1A:
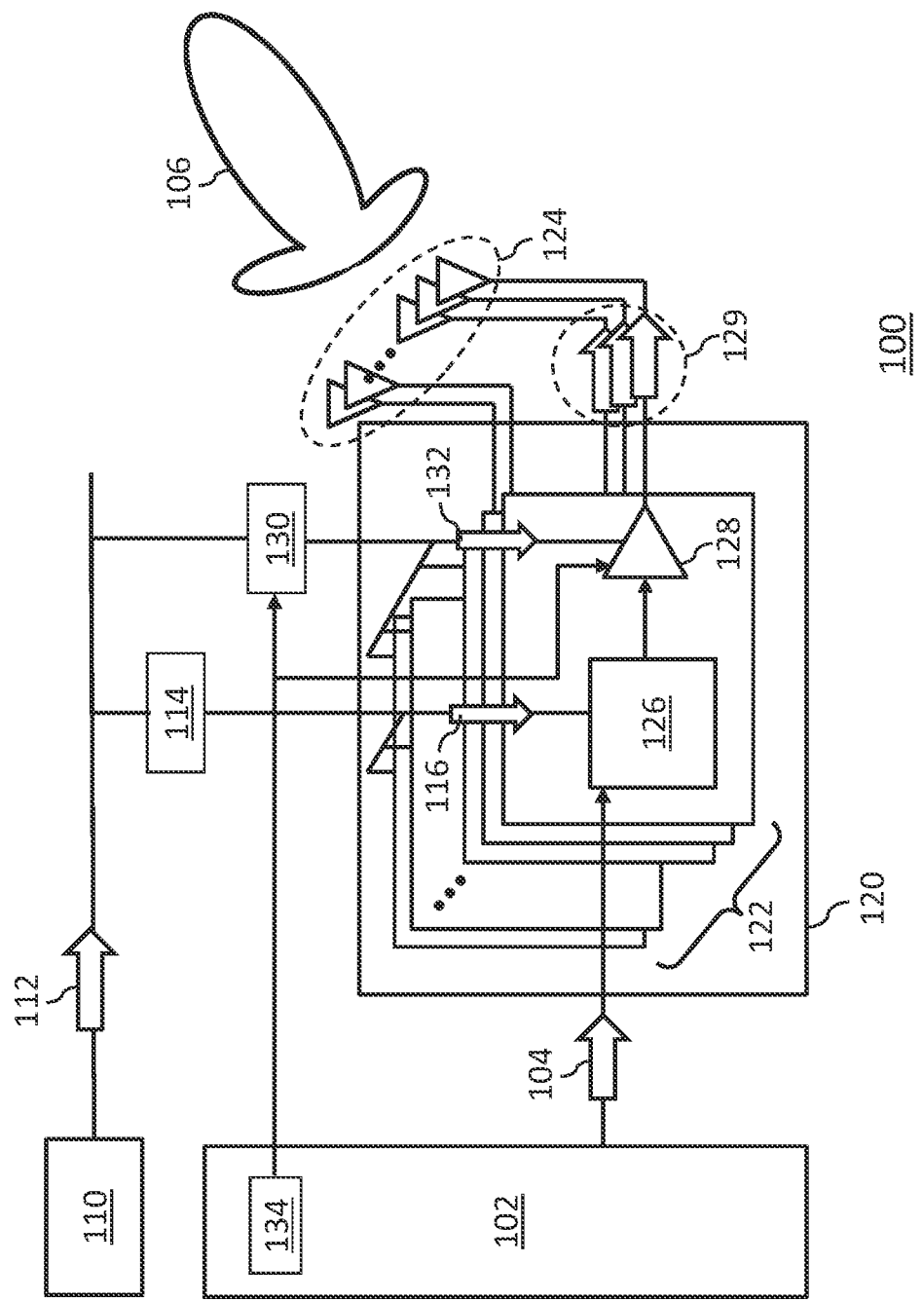
FIG. 1A is a diagram showing an example system that can implement dynamic amplifier supply in a phased antenna array in one embodiment.

FIG. 1A is a diagram showing an example system 100 that can implement dynamic amplifier supply in an antenna array in one embodiment. The system 100 can be a radio frequency (RF) transmission system implemented by a communication device, such as a RF transmitter. The system 100 can be configured to operate at common wireless radio frequencies, millimeter-wave frequencies, and/or microwave frequencies. The system 100 can be a part of a wireless communication network, such as fourth generation (4G) wireless communications system, fifth generation (5G) wireless communications system, satellite communication system, point-to-point communications systems such as common data link, and/or other types of wireless communication networks.

The system 100 can include a circuit 102, a beamformer chip (or "beamformer") 120, and a power supply 110. The power supply 110 can be configured to apply a supply voltage 112 to the circuit 102 and the beamformer 120. Various power management chips, such as power converters and/or voltage regulators, can be configured to perform voltage regulation for the circuit 102 and the beamformer 120. For example, one or more power management chips (not shown) can be connected between the power supply 110 (or another power supply) and the circuit 102 to perform voltage regulation for the circuit 102. A different power management chip 114 can be connected between the power supply 110 and the beamformer 120 to perform voltage regulation for a plurality of communication channels 122 ("channels 122") in the beamformer 120. The power management chip 114 can convert the supply voltage 112 into a regulated voltage 116, and the regulated voltage 116 can be provided to the beamformer 120 as a main regulated voltage or main power supply for the beamformer 120.

The circuit 102 can be a part of a transmitter device. For example, the circuit 102 can include a baseband processor, mixer circuits such as up-down converters, filters, memory devices, local oscillators, digital-to-analog converters (DAC), signal generators, microcontrollers, and/or other types of components or integrated circuits that belong to a transmitter device. The circuit 102 can be configured to output a radio frequency (RF) signal 104, where the RF signal 104 can be a radio-frequency, millimeter-wave frequency, or microwave frequency signal that can carry information or data. The circuit 102 can transmit the RF signal 104 to the beamformer 120.

The beamformer 120 can include the plurality of channels 122. In the example shown in FIG. 1A, the plurality of channels 122 can be transmission channels. Each channel among the plurality of channels 122 can include a beamformer circuit 126 and a power amplifier 128. The beamformer circuit 126 can include integrated circuits such as gain control circuits, phase shifters or phase control circuits, and/or other types of components or integrated circuits that can facilitate execution of beamforming techniques. The beamformer 120 can receive the RF signal 104 from the circuit 102. In an example, the plurality of channels 122 can receive the RF signal 104 at a common RF port of the beamformer 120. Each channel among the plurality of channels 122 can receive a copy of the RF signal 104 and set respective parameters, such as gain and phase, on its copy of the RF signal 104 to generate a respective beamforming signal 129.

The plurality of channels 122 can provide the beamforming signals 129 to a plurality of antenna elements 124. In an example, each antenna element can be a single antenna or a set of antennae connected together by junction or power splitter. The plurality of antenna elements 124 can be connected to the plurality of channels 122. In an example, each channel among the plurality of channels 122 can be connected to one antenna among the plurality of antenna elements 124. The plurality of antenna elements 124 can form a phased array antenna configured to output the beamforming signals 129 to form a beam 106. The beam 106 can broadcast the information or data bring carried by the RF signal 104. The beam 106 can have a field pattern and direction that can be based on the parameters (e.g., gain and phase) set by the beamformer circuit 126 in each one of the plurality of channels 122. For example, the plurality of antenna elements 124 can output respective beamforming signals 129 at different times based on the phase set by the plurality of channels 122. The different output times of the beamforming signals 129, and the different gain of the beamforming signals 129, can form the field pattern and direction of the beam 106. In an example, the beam 106 can be steered by the system 100 based on different combinations of phases set by the plurality of channels 122.

As mentioned above, the power supply 110 can be configured to apply supply voltage 112 to the beamformer 120. In the example shown in FIG. 1A, aside from the power management chip 114, another power management chip 130 can be connected between the power supply 110 and the power amplifier 128 of the beamformer 120. In an example, the power management chip 130 can be a power converter, such as a DC-DC converter. The power management chip 130 can be configured to convert the supply voltage 112 into regulated voltage 132 that can be same or different from the regulated voltage 116. The power management chip 130 can provide the regulated voltage 132 to the power amplifier 128 in each one of the plurality of channels 122. For example, if the plurality of channels 122 includes N transmission channels (each having a power amplifier 128), then the power management chip 130 can be connected between the power supply 110 and the N power amplifiers 128 in the N transmission channels. In some examples, the power amplifier 128 can be a multistage power amplifier, and the power management chip 130 can be connected to the last stage of the multistage power amplifier (e.g., the power amplifier stage that outputs the beamforming signals 129). By using the power management chip 130 as a dedicated power regulator for the power amplifier 128, a maximum power capability (e.g., maximum or peak voltage output) of the power amplifier 128 can be independently adjusted. For example, a power supply pin of the power amplifier 128 can be connected to the power management chip 130, instead of the power management chip 114. Thus, the maximum power capability or peak voltage of the power amplifier 128 can be set by the regulated voltage 132 supplied by the power management chip 130. In an example, the power management chip 130 can increase the regulated voltage 132 to be greater than the regulated voltage 116 in order to increase the power of the beamformer 120. In another example, the power management chip 130 can reduce the regulated voltage 132 to be lower than then regulated voltage 116, in order to decrease the power of the power amplifier 128 or the beamformer 120. In some examples, the reduction of power performed by the power management chip 130 can reduce an overall DC power consumption by the beamformer 120 for applications where high power may not be required. The adjustment to the maximum power capability of the power amplifier 128 can also define a maximum power capability of the corresponding channel among the plurality of channels 122. Further, the maximum power capability of the plurality of channels 122 can define a maximum power capability of the beamformer 120.

In some examples, the power management chip 130 can be located outside of the beamformer 120. For example, beamformer 120 can include a dedicated pin or interface connected to the power supply pin of the amplifier 128, such that the power management chip 130 can be a standalone chip outside of the beamformer 120 and can be connected to the amplifier 128 via the dedicated pin. The circuit 102 can include a controller 134. In some example, the power management chip 130 and/or the controller 134 can be packaged as a single device or apparatus that can be embedded or integrated in a communication device (e.g., circuit 102), integrated in the beamformer 120, or located outside of the circuit 102 and/or the beamformer 120. The controller 134 can include control logic that can configure the power amplifier 128 to accommodate the adjustment of the maximum power capability of the power amplifier 128. For example, the controller 134 can adjust bias current and/or bias voltage being supplied to the power amplifier 128 based on the adjustment of the maximum power capability of the power amplifier 128. By using the controller 134 to configure the power amplifier 128, a performance of the power amplifier 128 or the beamformer 120 while using the adjusted maximum power capability can be optimized. For example, the performance of the beamformer 120 can be optimized by reducing signal distortion generated by the power amplifier 128, in order to improve the quality of the beam 106 and therefore the capacity of the communication link established by the beam 106.

Figure 1B:
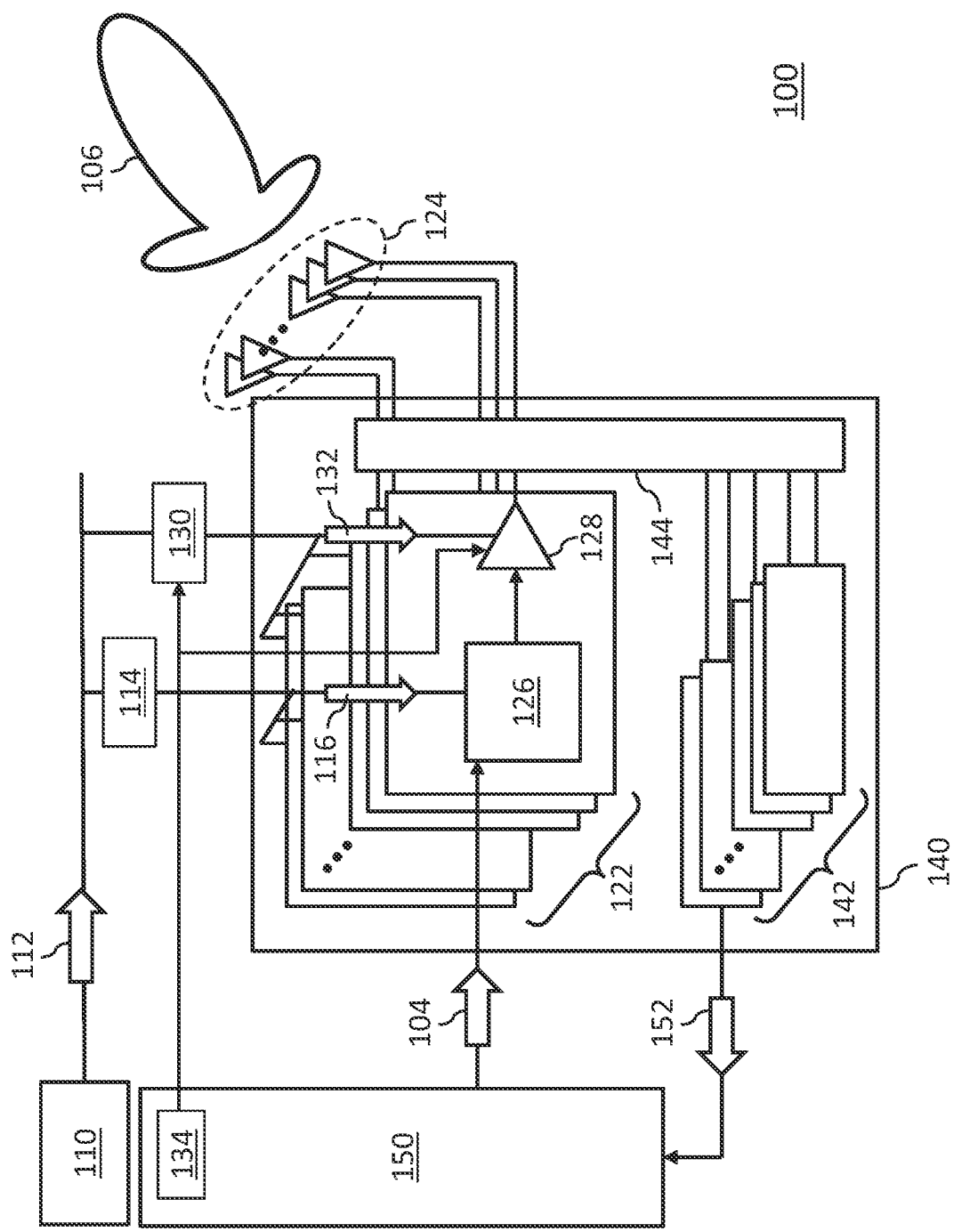
FIG. 1B is a diagram showing another example system that can implement dynamic amplifier supply in a phased antenna array in one embodiment.

Although the example in FIG. 1A shows the plurality of channels 122 in the beamformer 120, it will be apparent to a person of ordinary skill in the art that the beamformer 120 can include additional electronic components. For example, another example of the system 100 is shown in FIG. 1B, where the beamformer 120 can include a plurality of receiving channels 142. The beamformer 120 shown in FIG. 1A and/or FIG. 1B can be connected to another circuit 150, where the circuit 150 can be a transceiver. The circuit 150 can generate the RF signal 104 and can output the RF signal 104 to the beamformer 120. Further, the beamformer 120 can include a switch 144, where the switch 144 can include a plurality of ports connected to the plurality of antenna elements 124. The switch 144 can be switched to a transmission mode in order for the beamformer 120 to output the beamforming signals 129 to the plurality of antenna elements 124. The switch 144 can be switched to a receiving mode in order for signals (e.g., the beam 106 can be an incoming beam) received by the plurality of antenna elements 124 to be provided to the plurality of receiving channels 142 of the beamformer 120. The plurality of receiving channels 142 can decode the received signals and combine the decoded signals into a signal 152, and can transmit the signal 152 back to the circuit 150.

In some examples, the circuit 102 can further include a predistorter configured to perform digital predistortion on the signal 104. Digital predistortion can be a technique being used to reduce distortion in communication devices, such as radio transmitters, beamformers, etc. Digital Predistortion can introduce a controlled amount of distortion in the signal 104, and the introduced distortion can cancel out part of the distortion created by the power amplifiers 128. For example, if the power amplifier 128 shows signal compression (e.g., lower gain at larger amplitudes), the predistorter can introduce signal expansion (e.g., higher gain at larger amplitudes) in the signal 104 to obtain better fidelity and less distortion for the beamforming signals 129 and the beam 106. In another example, if the power amplifier 128 introduces phase lag at larger amplitudes (e.g., negative phase shift at larger amplitudes), the predistorter can introduce phase lead (e.g., positive phase shift at larger amplitudes) in signal 104 to obtain better fidelity and less distortion for the beamforming signals 129 and beam 106.

However, upon applying digital predistortion to the beamformer 120, the power capability of the beamformer 120 can be increased. This increase in power capability can cause the channels 122 to operate at power levels that can be excessive for some applications for which the system 100 is designed for. The dedicated power management chips described herein (e.g., power management chips 130) can set the regulated voltage 132 to a value lower than what would be needed without the application of digital predistortion to offset the increase being applied by the predistorter. Thus, a combination of digital predistortion and the dedicated power management chips described herein can lower a power consumption of a system that employs digital predistortion, effectively trading extra RF power for less DC power.

Figure 2:
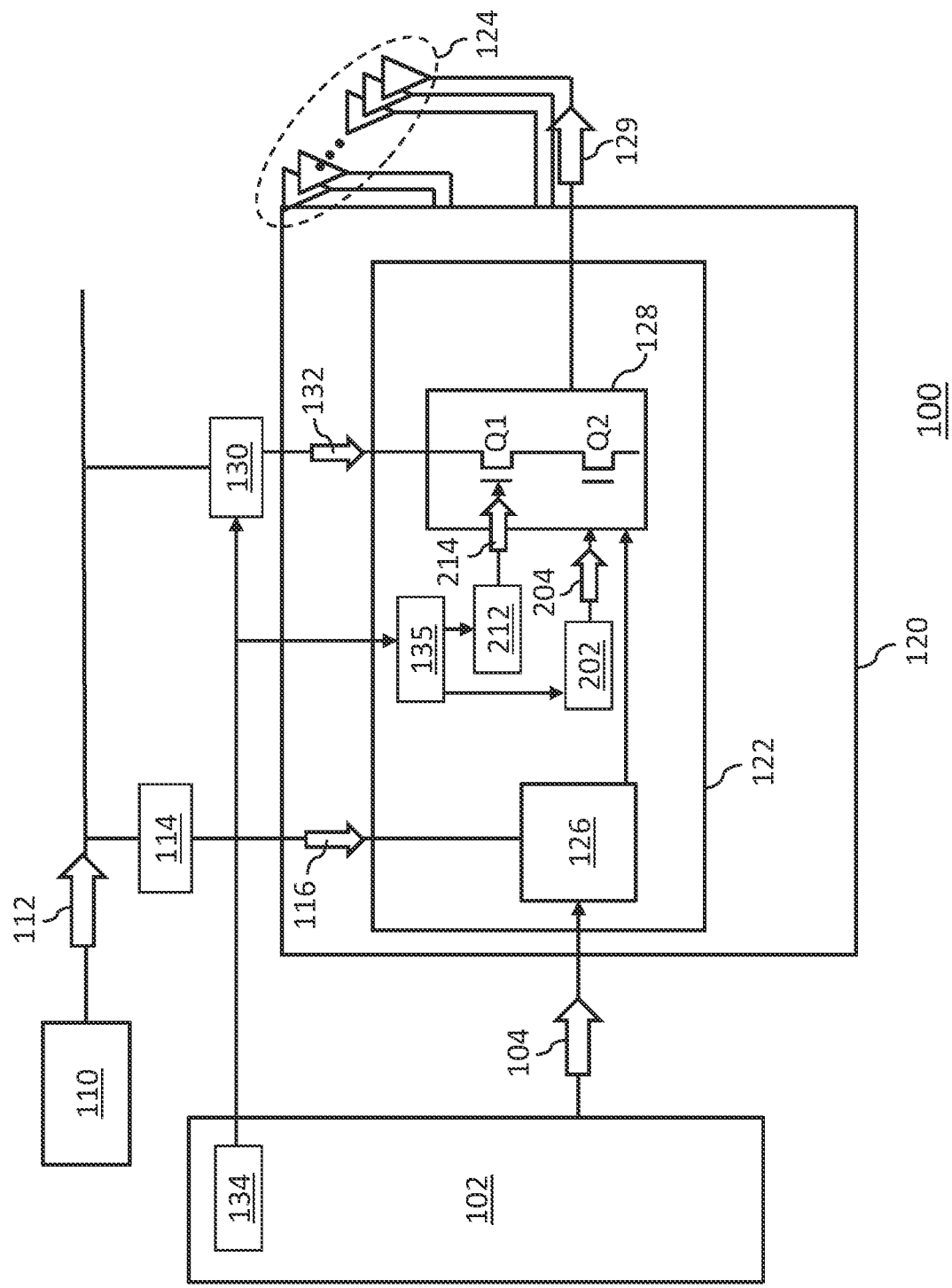
FIG. 2 is a diagram showing an implementation of a controller in a beamformer that can implement dynamic amplifier supply in a phased antenna array in one embodiment.

FIG. 2 is a diagram showing an implementation of a controller in a beamformer that can implement dynamic amplifier supply in phased antenna array in one embodiment. In the example shown in FIG. 2, the controller 134 can be configured to adjust a bias current 204 being applied to the power amplifier 128 based on the regulated voltage 132 provided by the power management chip 130. For example, in response to the maximum power capability of the power amplifier 128 being adjusted (increase or decrease) by the regulated voltage 132, the controller 134 can adjust (e.g., increase or decrease) the bias current 204 being applied to the power amplifier 128. In an example, the controller 134 can be configured to configure a bias current generator 202 that can be integrated in the beamformer 120. In another example, the controller 134 can be connected to the power management chip 130. The controller 134 can detect the regulated voltage 132 being applied to the power amplifier 128, and determine whether to configure the bias current generator 202 to increase or decrease the bias current 204 based on the regulated voltage 132. For example, the controller 134 can increase the bias current 204 in response to an increase in the regulated voltage 132, in order to optimize transistor linearity within the power amplifier 128, thus improving signal distortion.

In another example, the power amplifier 128 can be a cascode amplifier including a switching element Q1 and a switching element Q2. In an example, the switching elements Q1 and Q2 can be transistors such as bipolar junction transistors (BJT) or field-effect transistors (FET). It will be apparent to those skilled in the art that the depiction of the power amplifier 128, in FIG. 2, as a single-ended cascode amplifier is just an example. Various amplifier topologies can be implemented in the beamformer 120, including but not limited to, single-ended amplifiers, differential amplifiers, differential cascode amplifier, and amplifiers including a stack of more than two transistors. It will be also clear to those skilled in the art that the depiction of transistors Q1 and Q2 is just an exemplification. Various types of transistors can be used such as bipolar transistors, heterojunction bipolar transistors, graded junction bipolar transistors, high-electron-mobility transistors (HEMTs), pseudomorphic high-electron-mobility transistors (pHEMTs), or any transistor suitable for the specific design of the power amplifier 128. The controller 134 can be configured to adjust a cascode bias voltage 214 being applied to the switching element Q1 of the power amplifier 128 to optimize the power amplifier 128. For example, the controller 134 can be configured to configure a cascode bias voltage generator 212 that can be integrated in the beamformer 120. The controller 134 can provide commands o control signals to an interface 135 that can be integrated in the channel 122, where these commands or control signals can increase or decrease the cascode bias voltage 214. In some examples, the controller 134 can increase the cascode bias voltage 214 in response to an increase in the regulated voltage 132 to optimize the transistor linearity in the power amplifier 128. Furthermore, it will be apparent to those skilled in the art that the examples of adjusting the amplifier bias current 204 and/or the amplifier cascode voltage 214 are just examples of how the controller 134 may need to adjust the amplifier configuration in response to a change to the supply voltage 132. Other adjustment specific to other amplifier topologies can be implemented by the controller 134.

Figure 3A:
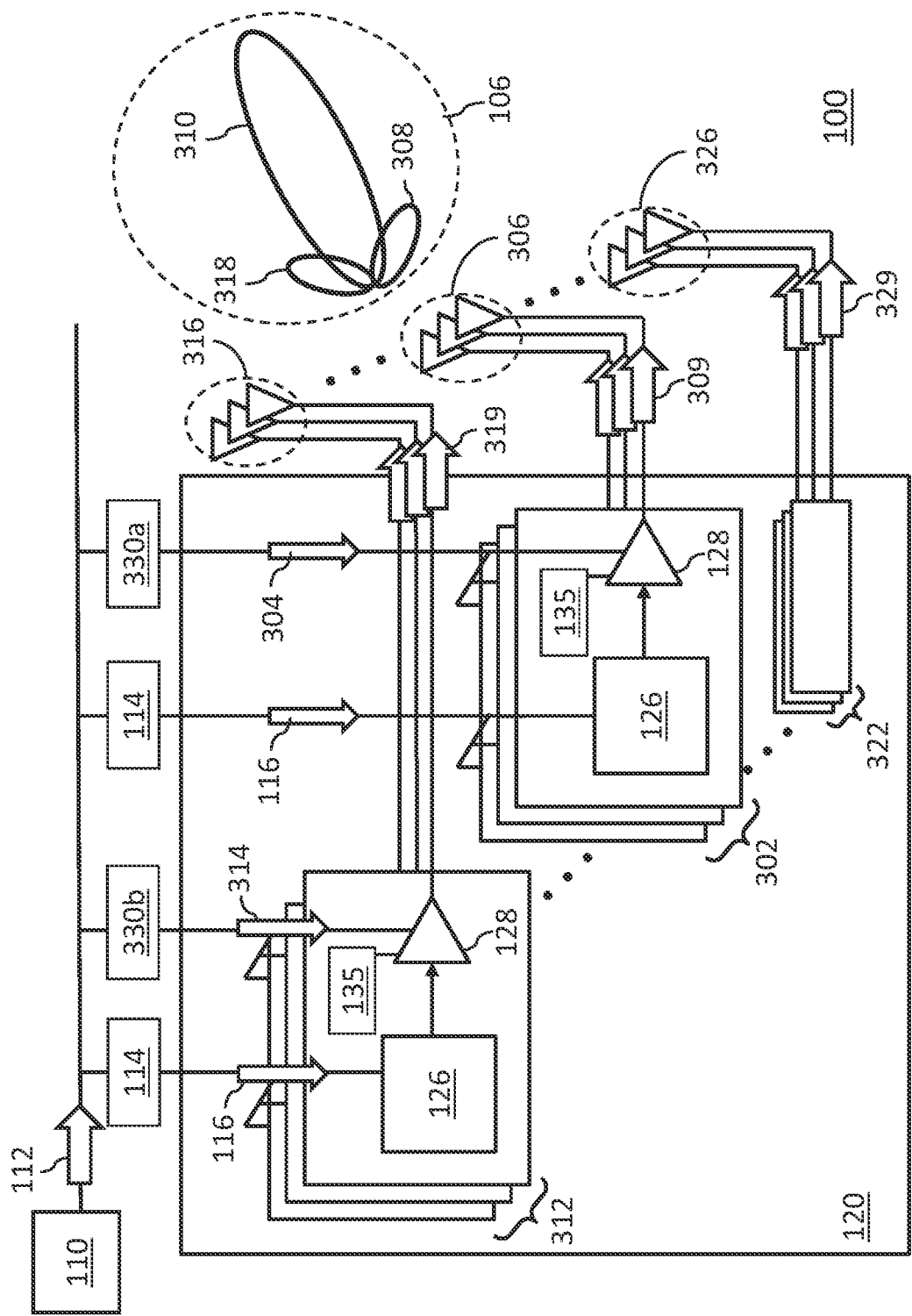
FIG. 3A is a diagram showing an example implementation of a system that can implement dynamic amplifier supply in a phased antenna array in one embodiment.

In some examples, the final stage of a transmission channel can draw a significant amount of current, and such current can include modulation that can disturb other parts of the transmission channel. Thus, separating the power supply to a last or final stage power amplifier can improve the transmitter fidelity and signal quality. The system 100 can be implemented with these separated power supply to improve an overall performance of the beamformer 120. Further, the dedicated power management chips in the system 100 can avoid changes to power specifications of a beamformer during a development cycle, thus avoiding design iterations that can lead to issues such as additional development cost and time. The system 100 can also be designed with the flexibility to adjust power specifications such that overdesign issues and unnecessary SKU proliferation can be avoided FIG. 3A is a diagram showing an example implementation of a system that can implement dynamic amplifier supply in a phased antenna array in one embodiment. In an example, to achieve a desired beam power, shape, or amplitude, particular sections of a phased antenna array can be tapered to reduce the amplitude of side lobes of the beam. For example, the antennas that may be located further away from a center of a phased antenna array can have their power reduced or suppressed (e.g., tapered) in order to shape the beam to a desired tapering profile. If all power amplifiers in all transmission channels are supplied by the same regulated voltage (e.g., 116 shown in FIG. 1A), then the channels driving the tapered antenna elements can be operating inefficiently because they can be operating at a power level that is lower than what would be possible under the regulated voltage 116. To address this inefficiency, the system 100 can use different dedicated power management chips to independently adjust the maximum power capability of different groups of transmission channels.

Figure 3B:
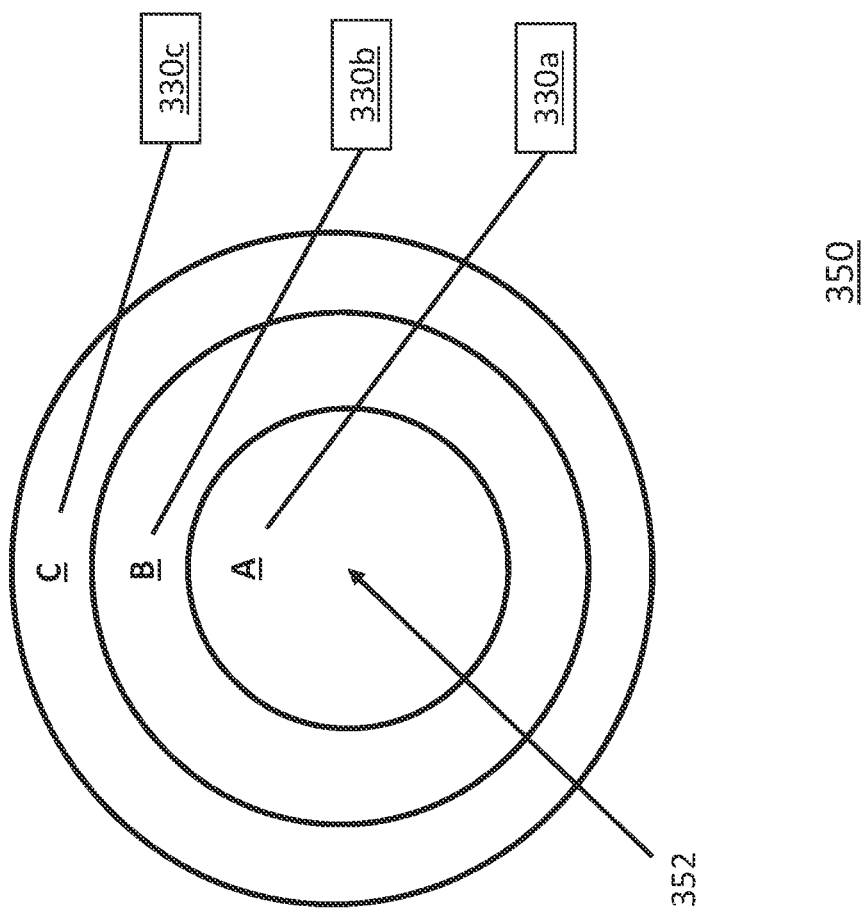
FIG. 3B is a diagram showing a phased antenna array that can be used for the example implementation shown in FIG. 3A in one embodiment.

For example, the dedicated power management chips can lower the maximum power capability of transmission channels connected to the antennas that may be located further away from the center of a phased antenna array, such that the suppressed power of these antennas can be closer to their lowered maximum power requirement. The dedicated power management chips can partition the system 100 into different power domains that can serve different regions of a phased antenna array, allowing lower voltage to be applied to antennas that may be farther from the array center and required to transmit less power due to a desired tapering profile. Thus, the system 100 can improve an efficiency of the beamformer 120 when the beamformer 120 performs antenna tapering. In an example shown in FIG. 3B, a circular phased antenna array 350 is shown having different subsections A, B, and C. Each subsection among subsections A, B, and C can include a respective number of antennas. The subsection A can include antennas being closest to a center 352 of the phased antenna array, and the subsection C can include antennas being furthest away from the center 352. Different dedicated power management chips 330a, 330b, 330c can be configured to set a respective maximum power capability of transmission channels connected to the subsections A, B, and C.

Returning to the example of FIG. 3A, the beam 106 can include a main lobe 310, a side lobe 308, and a side lobe 318. The beamformer 120 can perform tapering to reduce the amplitude of the side lobes 308 and 318, and may increase an amplitude of the main lobe 310, based on a desired tapering profile. In some examples, among a phased antenna array, antennas that are physically located farther away from a center of the phased antenna array are the antennas that can undergo tapering. For example, the plurality of antenna elements 124 can include at least a group of antennas 306, a group of antennas 316, and a group of antennas 316. The group of antennas 306 can be connected to a group of channels 302, the group of antennas 316 can be connected to a group of channels 312, and the group of antennas 326 can be connected to a group of channels 322. The groups of channels 302, 312, and 322 can be transmission channels among the plurality of channels 122 shown in FIG. 1A, FIG. 1B, and FIG. 2. In an example, the groups of antennas 306, 316, and 326 can be antennas in the subsections A, B, and C, shown in FIG. 3B, respectively. In an example, the groups of antennas 316 and 326 (e.g., subsection B and C in FIG. 3B) can undergo different amounts of tapering to reduce the side lobes 308 and 318 in order to shape the beam 106 to a desired shape.

In the example shown in FIG. 3A, the power management chip or power converter 330a (also shown in FIG. 3B) can be connected between the power supply 110 and the power amplifier 128 in every channel among the group of channels 302. The power management chip or power converter 330b (also shown in FIG. 3B) can be connected between the power supply 110 and the power amplifier 128 in every channel among the group of channels 312. Another power management chip or power converter (e.g., 330c shown in FIG. 3B) can be connected between the power supply 110 and the power amplifier 128 in every channel among the group of channels 322. In an example, the power management chips 330a, 330b, and 330c can be power converters, such as a DC-DC converters. The power management chips 330a, 330b, and 330c can independently adjust the maximum power capability of the power amplifier 128 in the groups of channels 302, 312, and 322. For example, the power management chip 330a can generate and apply a regulated voltage 304 to the power amplifiers 128 of the group of channels 302 to adjust the maximum power capability of the power amplifier 128 in the group of channels 302. The power management chip 330b can generate and apply a regulated voltage 314 to the power amplifiers 128 of the group of channels 312 to adjust the maximum power capability of the power amplifier 128 in the group of channels 312.

In an example, a subset of the group of antennas 306 can be tasked with providing the highest power within the group of antennas 306. The power management chip 330a can be configured to convert the supply voltage 112 into a regulated voltage (e.g., regulated voltage 304) that can be sufficient for operations of the group of channels 302. For example, the regulated voltage 304 can be high enough to allow the power amplifiers 128 among the group of channels 302 to deliver their required power with acceptable signal fidelity, and also reduce power consumption by the group of channels 302. Thus, the power amplifiers 128 in the group of channels 302 can operate closer to their maximum power capability because they are supplied with a lower voltage (e.g., regulated voltage 304) to make a lower power, which intrinsically makes the operation of the group of channels 302 more efficient.

In an example, the dedicated power management chips (e.g., power management chips 130, 330a, 330b, 330c) described herein can be configured based on the power required by each subsection (e.g., subsections A, B, C shown in FIG. 3B) of the plurality of antenna elements 124 to achieve a desired tapering profile. The desired tapering profile can indicate, for example, the highest power required by a subset of each groups of channels or antennas in the system 100. For example, a desired tapering profile can indicate a first highest power required of the group of channels 302, a second highest power required of the group of channels 312, and a third highest power required of the group of channels 322. A controller (e.g., controller 134, or another controller that can be integrated in the circuit 102, the circuit 150, or the beamformer 120) can configure the dedicated power management chips connected to the groups of channels 302, 312, 322, based on the first, second, and third highest power required indicated by the desired tapering profile. Further, the control circuits 126 can adjust the gain of the corresponding channels to achieve a desired signal amplitude that can be indicated by the desired tapering profile. As such, the desired tapering profile can be achieved, and in addition, each power amplifier 128 in each group of channels 302. 312, 322 can operate closer to its maximum power capability, which intrinsically improves the efficiency of the entire tapered antenna array, thus reducing DC power consumption. It will be clear that the example of partitioning the array into 3 subsection (shown in FIG. 3B) is only for exemplary purposes, and any number of subsections can be implemented, based on the desired complexity and efficiency optimization of the system 100.

Figure 4:
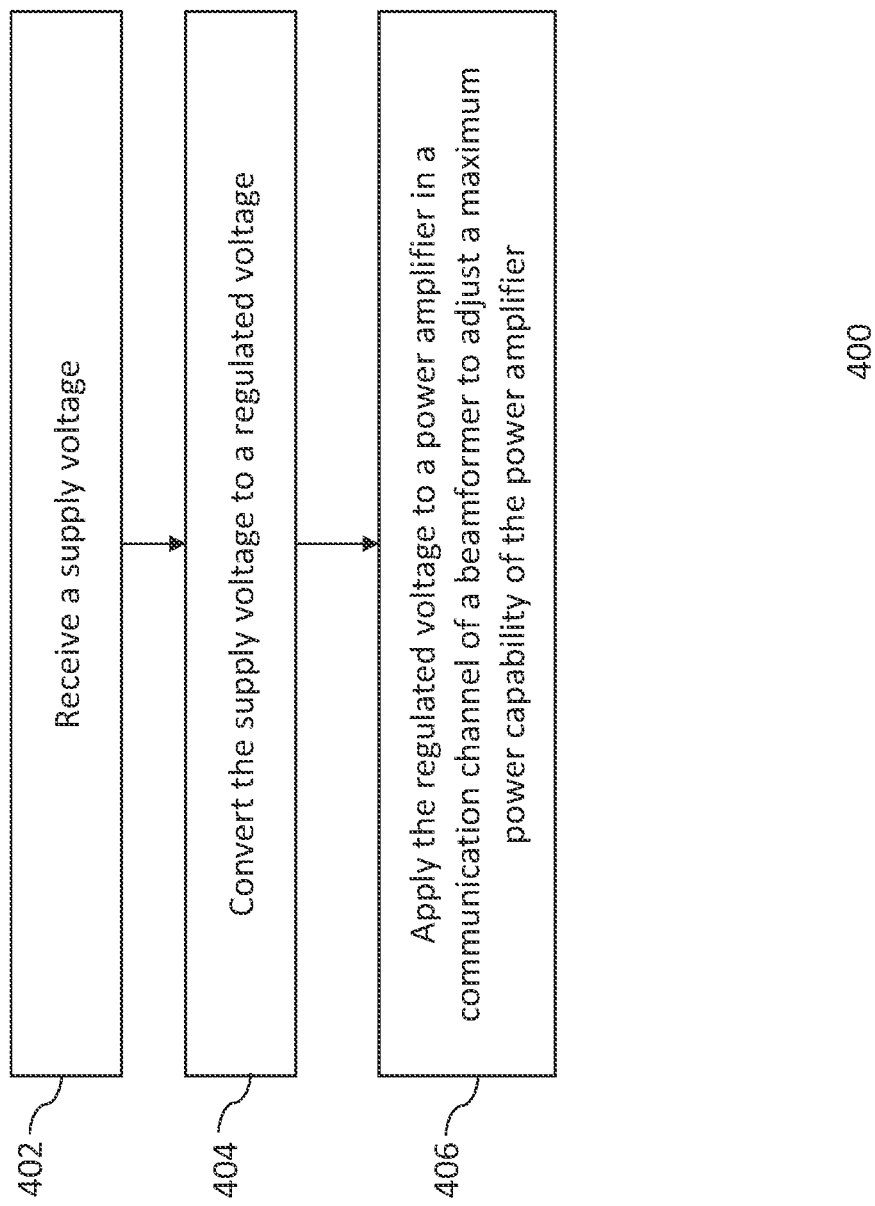
FIG. 4 is a flow diagram illustrating a process of implementing dynamic amplifier supply in a phased antenna array in one embodiment.

FIG. 4 is a flow diagram illustrating a process to implement dynamic amplifier supply in phased antenna array in one embodiment. The process can include one or more operations, actions, or functions as illustrated by one or more of blocks 402, 404, and/or 406. Although illustrated as discrete blocks, various blocks can be divided into additional blocks, combined into fewer blocks, eliminated, or performed in parallel, depending on the desired implementation.

The process 400 can begin at block 402. At block 402, an apparatus can receive a supply voltage. The process 400 can proceed from block 402 to block 404. At block 404, the apparatus can convert the supply voltage to a regulated voltage. The process 400 can proceed from block 404 to block 406. At block 406, the apparatus can apply the regulated voltage to a power amplifier in a communication channel of a beamformer to adjust a maximum power capability of the power amplifier. In some examples, the regulated voltage being applied to the power amplifier can be different from a main regulated voltage being applied to the beamformer. In some examples, the power amplifier can be a final power amplifier stage of the communication channel. In some examples, the communication channel can be a transmission channel of the beamformer.

In some examples, a controller of the apparatus can adjust a bias current being applied to the power amplifier based on the adjusted maximum power capability of the power amplifier. In some examples, the power amplifier can be a cascode amplifier. The controller of the apparatus can adjust a bias voltage being applied to an upper switching element of the cascode amplifier based on the adjusted maximum power capability of the power amplifier. In some examples, the apparatus can determine an amount of power required by the power amplifier to achieve a desired tapering configuration of the beamformer. The apparatus can further adjust the regulated voltage based on the determined amount of power.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a controller configured to:
configure a power capability of a power amplifier in a communication channel of a beamformer by:
determining a maximum power capability for the power amplifier;
determining, based on the maximum power capability, a regulated voltage to be supplied to the power amplifier; and
causing a power converter to:
convert a supply voltage to the regulated voltage; and
supply the regulated voltage to the power amplifier.

2. The apparatus of claim 1, wherein the regulated voltage is different from a main regulated voltage being applied to the beamformer.

3. The apparatus of claim 1, wherein the power amplifier is a final power amplifier stage of the communication channel.

4. The apparatus of claim 1, wherein the controller is further configured to:
determine, based on the maximum power capability or the regulated voltage, a bias current to be supplied to the power amplifier; and
cause the bias current to be supplied to the power amplifier.

5. The apparatus of claim 4, wherein the controller is further configured to cause the bias current to increase in response to an increase of the maximum power capability or the regulated voltage.

6. The apparatus of claim 1, wherein:
the power amplifier is a cascode amplifier; and
the controller is further configured to:
determine, based on the maximum power capability or the regulated voltage, a bias voltage to be supplied to the cascode amplifier; and
cause the bias voltage to be applied to an upper switching element of the cascode amplifier.

7. The apparatus of claim 1, wherein the communication channel is a transmission channel of the beamformer.

8. The apparatus of claim 1, wherein the controller is further configured to determine the maximum power capability for the power amplifier based on
a desired tapering configuration of the beamformer.

9. A system comprising:
an antenna array;

a beamformer connected to the antenna array, the beamformer comprising a communication channel with a power amplifier;
a first power converter configured to:
   convert a supply voltage to a first regulated voltage; and
   apply the first regulated voltage to the beamformer; and
a controller configured to:
   configure a power capability of the power amplifier by:
      determining a maximum power capability for the power amplifier;
      determining, based on the maximum power capability, a second regulated voltage to be supplied to the power amplifier; and
      causing a second power converter to:
         convert the supply voltage to the second regulated voltage; and
         supply the second regulated voltage to the power amplifier.

10. The system of claim 9, wherein the power amplifier is a final power amplifier stage of the communication channel.

11. The system of claim 9, wherein the controller is further configured to:
   determine, based on the maximum power capability or the second regulated voltage, a bias current to be supplied to the power amplifier; and
   cause the bias current to be supplied to the power amplifier.

12. The system of claim 9, wherein:
the power amplifier is a cascode amplifier; and
the controller is further configured to cause a bias voltage generator to apply a bias voltage to an upper switching element of the cascode amplifier based on the second regulated voltage.

13. The system of claim 9, wherein the communication channel is a transmission channel of the beamformer.

14. The system of claim 9, wherein the controller is further configured to
   determine the maximum power capability for the power amplifier based on a desired tapering configuration of the beamformer.

15. The system of claim 9, further comprising a transmitter connected to the beamformer.

16. The system of claim 9, further comprising a transceiver connected to the beamformer.

17. A method of operating a beamformer, the method comprising:
   configuring a power capability of a power amplifier in a communication channel of the beamformer by:
      determining a maximum power capability for the power amplifier;
      determining, based on the maximum power capability, a regulated voltage to be supplied to the power amplifier; and
      causing a second power converter to:
         convert a supply voltage to the regulated voltage; and
         supply the regulated voltage to the power amplifier.

18. The method of claim 17, further comprising:
determining, based on at least one of the maximum power capability or the regulated voltage, a bias current for the power amplifier;
causing a current generator to:
   generate the bias current; and
   apply the the bias current to the power amplifier.

19. The method of claim 17, wherein:
the power amplifier is a cascode amplifier; and
the method further comprises:
   determining, based on the maximum power capability or the regulated voltage, a bias voltage for the power amplifier; and
   causing a bias voltage generator to:
      generate the bias voltage; and
      apply the bias voltage to an upper switching element of the cascode amplifier.

20. The method of claim 17,
wherein the determining the maximum power capability is based on a desired tapering configuration of the beamformer.

* * * * *